United States Patent
Hu et al.

(10) Patent No.: US 10,047,222 B2
(45) Date of Patent: Aug. 14, 2018

(54) RESIN COMPOSITION AND PRODUCT MADE THEREFROM

(71) Applicant: Elite Electronic Material (Zhongzhan) Co., Ltd., Zhongshan, Guang Dong Province (CN)

(72) Inventors: Zhilong Hu, Zhongshan (CN); Xiang Xiong, Zhongshan (CN); Xingfa Chen, Zhongshan (CN)

(73) Assignee: Elite Electronic Material (Zhongshan) Co., Ltd., Zhongshan, Guang Dong Province (CN)

( * ) Notice: Subject to any disclaimer, the term of this patent is extended or adjusted under 35 U.S.C. 154(b) by 77 days.

(21) Appl. No.: 15/258,722

(22) Filed: Sep. 7, 2016

(65) Prior Publication Data
US 2017/0327683 A1   Nov. 16, 2017

(30) Foreign Application Priority Data
May 12, 2016   (CN) .......................... 2016 1 0319236

(51) Int. Cl.
| | |
|---|---|
| C08L 63/00 | (2006.01) |
| C08L 63/04 | (2006.01) |
| C08J 5/24 | (2006.01) |
| H05K 1/03 | (2006.01) |

(52) U.S. Cl.
CPC ............... C08L 63/00 (2013.01); C08J 5/24 (2013.01); C08L 63/04 (2013.01); H05K 1/0353 (2013.01); C08J 2363/00 (2013.01); C08J 2363/04 (2013.01); C08J 2425/08 (2013.01); C08J 2463/10 (2013.01); C08J 2479/04 (2013.01); C08L 2203/20 (2013.01); C08L 2205/035 (2013.01); H05K 2201/068 (2013.01)

(58) Field of Classification Search
CPC ...... C08J 5/24; C08J 2363/00; C08J 2425/08; C08J 2471/00; C08J 2363/04; C08J 2479/04; C08J 2463/10; C08L 63/04; C08L 2203/20; C08L 2205/035; C08L 63/00; H05K 1/0373; H05K 2201/068
USPC ........................................................ 523/400
See application file for complete search history.

(56) References Cited

U.S. PATENT DOCUMENTS

| | | | |
|---|---|---|---|
| 2009/0054587 A1* | 2/2009 | Oshimi | C08G 59/245 524/612 |
| 2011/0224332 A1* | 9/2011 | He | C08G 59/42 523/456 |
| 2014/0178656 A1* | 6/2014 | Li | C09D 163/00 428/209 |

FOREIGN PATENT DOCUMENTS

CN   104974469 A   * 10/2015   .............. C08L 63/00

OTHER PUBLICATIONS

CN 104974469 A machine translation in English, Oct. 14, 2015 (Year: 2015).*

* cited by examiner

*Primary Examiner* — David T Karst
(74) *Attorney, Agent, or Firm* — Muncy, Geissler, Olds & Lowe, P.C.

(57) ABSTRACT

Provided is a resin composition, comprising epoxy resin, oxydianiline type benzoxazine resin, styrene-maleic anhydride resin and tetra-phenol resin. The resin composition may be baked for producing products such as prepregs, resin films, resin-coated coppers, laminates and printed circuit boards, which satisfy one or more or all of desirable properties such as higher dimensional stability after a reflow process, better thermal resistance after horizontal black oxide process, low dielectric constant, low dissipation factor, high thermal resistance and flame retardancy.

22 Claims, No Drawings

RESIN COMPOSITION AND PRODUCT MADE THEREFROM

CROSS-REFERENCE TO RELATED APPLICATIONS

This Application claims priority of China Patent Application No. 201610319236.0, filed on May 12, 2016, the entirety of which is incorporated by reference herein.

BACKGROUND OF THE INVENTION

Field of the Invention

The present disclosure relates to a resin composition and more particularly to a resin composition which may be used for producing articles such as prepregs, resin films, resin-coated coppers, laminates and printed circuit boards.

Description of Related Art

Printed circuit boards are one of the essential components of many electronic products, such as smart phones, and they are served to provide electronic signal transmission among different electronic components. In recent years, several technical solutions have been employed, such as high density interconnection (HDI), by printed circuit board manufacturers to reduce the size or thickness of printed circuit boards, so as to form denser trace connections within the same or even smaller size or thickness.

In a process of fabricating a printed circuit board, a conventional surface treatment process of an inner-layer circuit board is black oxide, with the purpose of increasing a bonding strength between a copper-clad surface of the inner-layer circuit board and a prepreg. Horizontal black oxide is one of the black oxide processes; however, after a conventional resin material is bonded with the copper-clad surface subjected to the horizontal black oxide process, the overall thermal resistance is undesirably and greatly reduced, and delamination occurs in thermal resistance tests. Therefore, a trend of developing new materials in the future is to provide a resin material which can be matched with the copper-clad surface subjected to the horizontal black oxide process and which has better thermal resistance. After the printed circuit board is fabricated, when a surface component (such as an active component or a passive component) is mounted on the printed circuit board, there is a need for performing a reflow process, so that a molten lead-free solder bonds the surface component to a metal trace on the printed circuit board. Due to the application of thermal shock, after being subjected to the reflow process, the resin material typically used for producing an insulation layer of the printed circuit board easily deforms due to different thermal expansion degrees, which results in warpage deformation of a substrate, reduced flatness, and subsequent poor soldering, such as false soldering.

With densification and increased heat-producing capacity of the printed circuit board, there is a need for presenting a resin composition which can conform to requirements of various characteristics of the printed circuit board, especially a resin composition which can satisfy demands in various aspects such as dimensional stability, thermal resistance and dielectric properties of a product made therefrom.

SUMMARY OF THE INVENTION

In view of the problems encountered in the conventional arts, the disclosure provides a resin composition, including epoxy resin, oxydianiline type benzoxazine resin (ODA-Bz), styrene-maleic anhydride (SMA) resin and tetra-phenol resin.

In the aforesaid resin composition, the epoxy resin includes at least one or a combination of two or more of the following group: bisphenol A epoxy resin, bisphenol F epoxy resin, bisphenol S epoxy resin, bisphenol AD epoxy resin, phenol novolac epoxy resin, trifunctional epoxy resin, tetrafunctional epoxy resin, multifunctional epoxy resin, dicyclopentadiene (DCPD) epoxy resin, phosphorous-containing epoxy resin, p-xylene epoxy resin, naphthalene epoxy resin (e.g. naphthol epoxy resin), benzofuran epoxy resin, isocyanurate-modified epoxy resin, and phenol aralkyl novolac epoxy resin, wherein the phenol novolac epoxy resin may comprise bisphenol A novolac epoxy resin, bisphenol F novolac epoxy resin, biphenyl novolac epoxy resin, phenol benzaldehyde epoxy resin, phenol aralkyl novolac epoxy resin or o-cresol novolac epoxy resin, wherein the phosphorus-containing epoxy resin may comprise DOPO (9,10-dihydro-9-oxa-10-phosphaphenanthrene-10-oxide) epoxy resin, DOPO-HQ epoxy resin or a combination thereof. The DOPO epoxy resin may be selected from one or more than one of DOPO-containing phenolic novolac epoxy resin, DOPO-containing cresol novolac epoxy resin and DOPO-containing bisphenol A novolac epoxy resin; the DOPO-HQ epoxy resin may be selected from one or more than one of DOPO-HQ-containing phenolic novolac epoxy resin, DOPO-HQ-containing cresol novolac epoxy resin and DOPO-HQ-containing bisphenol A novolac epoxy resin.

In the aforesaid resin composition, the molar ratio of styrene to maleic anhydride in the styrene-maleic anhydride resin is 1:1, 2:1, 3:1, 4:1, 6:1, 8:1 or 12:1. Useful styrene-maleic anhydride may be but not limited to styrene-maleic anhydride copolymers such as products SMA-1000, SMA-2000, SMA-3000, EF-30, EF-40, EF-60 and EF-80 available from Cray Valley. In addition, the styrene-maleic anhydride resin may also be an esterified styrene-maleic anhydride copolymer, such as esterified styrene-maleic anhydride copolymers like SMA1440, SMA17352, SMA2625, SMA3840 and SMA31890 available from Cray Valley. The above styrene-maleic anhydride resin may be added to the resin composition alone or in combination.

In the aforesaid resin composition, the tetra-phenol resin has a structure as below:

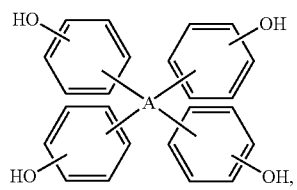

wherein A is a $C_2$ to $C_6$ alkylene, such as a straight or branched alkylene with a carbon number of 2, 3, 4, 5 or 6.

For example, the tetra-phenol resin may have a structure as below:

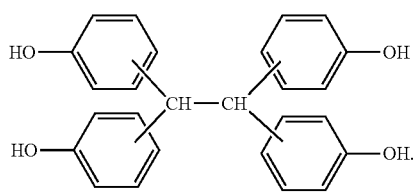

Preferably, the tetra-phenol resin has a structure as below:

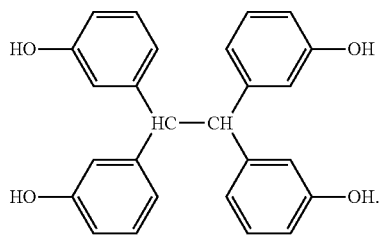 [SMILES: Oc1cccc(C(c2cccc(O)c2)C(c2cccc(O)c2)c2cccc(O)c2)c1]

In the present disclosure, the inventors have found that compared with other phenol resin (for example, dicyclopentadiene phenol resin or phenol novolac resin), the resin composition of the present disclosure provides a better laminate thermal resistance after the tetra-phenol resin is crosslinked with other resin components in the resin composition, particularly achieving high thermal resistance in solder dipping test and high thermal resistance in PCT test after the horizontal black oxide process.

In a preferred embodiment of the above resin composition, the oxydianiline type benzoxazine resin has a structure as below:

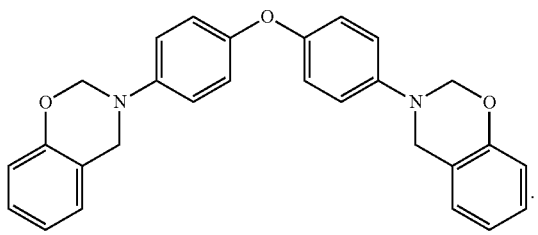 [SMILES: c1ccc2c(c1)CN(c1ccc(Oc3ccc(N4COc5ccccc5C4)cc3)cc1)CO2]

In the present disclosure, the inventors have found that compared with other bisphenol A type benzoxazine resin, bisphenol F type benzoxazine resin or phenolphthalein type benzoxazine resin, the resin composition of the disclosure provides a better dimensional change after reflow when the oxydianiline type benzoxazine resin is crosslinked with other resin components in the resin composition.

In the aforesaid resin composition, amounts of the epoxy resin, the oxydianiline type benzoxazine resin, the styrene-maleic anhydride resin and the tetra-phenol resin are not particularly limited. In one preferred embodiment, the resin composition includes 100 parts by weight of the epoxy resin, 20 to 70 parts by weight of the oxydianiline type benzoxazine resin, 15 to 60 parts by weight of the styrene-maleic anhydride resin and 3 to 15 parts by weight of the tetra-phenol resin. A product made from the preferred formulation of the resin composition has one or more or all of better overall characteristics, such as higher dimensional stability after a reflow process, better thermal resistance after a horizontal black oxide process, low dielectric constant, low dissipation factor, high thermal resistance and flame retardancy.

In one embodiment, the resin composition further includes polyphenylene ether resin, cyanate ester resin, isocyanurate resin, polyolefin resin, maleimide, polyester, an amine curing agent, polyamide, polyimide or a combination thereof.

Unless otherwise specified, a useful polyphenylene ether resin of this disclosure is not particularly limited, and may be any one or more polyphenylene ether resins suitable for making a prepreg, a resin film, a resin-coated copper, a laminate or a printed circuit board. Examples include but not limited to dihydroxyl polyphenylene ether resin (such as SA-90 available from Sabic), divinylbenzyl polyphenylene ether resin (such as OPE-2st available from Mitsubishi Gas Chemical), vinylbenzyl-modified bisphenol A polyphenylene ether or methacrylate polyphenylene ether resin (such as SA-9000 available from Sabic).

Unless otherwise specified, a useful cyanate ester resin of this disclosure is not particularly limited, and may be any one or more cyanate ester resins suitable for making a prepreg, a resin film, a resin-coated copper, a laminate or a printed circuit board. For example, the resin composition may include any compound having Ar—O—C≡N structure, where Ar is a substituted or unsubstituted aromatic group. Examples include but not limited to phenol novolac cyanate ester resin, bisphenol A cyanate ester resin, bisphenol F cyanate ester resin, dicyclopentadienyl-containing cyanate ester resin, naphthalene-containing cyanate ester resin, phenolphthalein cyanate ester resin, adamantane cyanate ester resin or fluorene cyanate ester resin, wherein the phenol novolac cyanate ester resin may comprise bisphenol A phenol novolac cyanate ester resin, bisphenol F phenol novolac cyanate ester resin or a combination thereof. Examples of the cyanate ester resin include but not limited to Primaset PT-15, PT-30S, PT-60S, CT-90, BADCY, BA-100-10T, BA-200, BA-230S, BA-3000S, BTP-2500, BTP-6020S, DT-4000, DT-7000, Methylcy, and ME-240S, which are manufactured by Lonza.

Unless otherwise specified, the isocyanurate resin of the disclosure is not particularly limited and may be any one or more isocyanurate resins suitable for making a prepreg, a resin film, a resin-coated copper, a laminate or a printed circuit board. Examples include but not limited to 1,4-cyclohexane diisocyanate, isophorone diisocyanate, methylene bis(4-cyclohexylisocyanate), triallyl isocyanate (TAIC), hydrogenated 1,3-xylylene diisocyanate and hydrogenated 1,4-xylylene diisocyanate.

Unless otherwise specified, the polyolefin resin of the disclosure is not particularly limited and may be any one or more polyolefin resins suitable for making a prepreg, a resin film, a resin-coated copper, a laminate or a printed circuit board. Examples include but not limited to at least one or a combination of two or more of styrene-butadiene-divinylbenzene terpolymer, styrene-butadiene-maleic anhydride terpolymer, vinyl-polybutadiene-urethane oligomer, styrene-butadiene copolymer, hydrogenated styrene-butadiene copolymer, styrene-isoprene copolymer, hydrogenated styrene-isoprene copolymer, methylstyrene copolymer, petroleum resin and cyclic olefin copolymer.

Unless otherwise specified, the maleimide of the disclosure is not particularly limited and may be any one or more maleimides suitable for making a prepreg, a resin film, a resin-coated copper, a laminate or a printed circuit board. Examples include but not limited to at least one or a combination of two or more of 4,4'-diphenylmethane bismaleimide, oligomer of phenylmethane maleimide, m-phenylene bismaleimide, bisphenol A diphenyl ether bismaleimide, 3,3'-dimethyl-5,5'-diethyl-4,4'-diphenylmethane bismaleimide, 4-methyl-1,3-phenylene bismaleimide, 1,6-bismaleimide-(2,2,4-trimethyl hexane), N-2,3-xylylmaleimide, N-2,6-xylenemaleimide, N-phenylmaleimide and a prepolymer thereof, wherein the prepolymer may be for example formed from a diallyl compound and a maleimide compound.

Unless otherwise specified, the polyester of the disclosure is not particularly limited and may be any one or more polyesters suitable for making a prepreg, a resin film, a resin-coated copper, a laminate or a printed circuit board. Examples include but not limited to HPC-8000T65 available from D.I.C.

Unless otherwise specified, the amine curing agent of the disclosure is not particularly limited and may be any one or more amine curing agents suitable for making a prepreg, a resin film, a resin-coated copper, a laminate or a printed circuit board. Examples include but not limited to diamino diphenyl sulfone, diamino diphenyl methane, diamino diphenyl ether, diamino diphenyl sulphide, dicyandiamide or a combination thereof.

In one embodiment, the resin composition further includes one or more than one additives selected from the following group: a curing accelerator, a flame retardant, an inorganic filler, a solvent, a toughening agent and a silane coupling agent.

Unless otherwise specified, the aforesaid curing accelerator may increase the curing rate of resin and may be any one or more curing accelerators suitable for making a prepreg, a resin film, a resin-coated copper, a laminate or a printed circuit board. It may comprise catalysts, such as a Lewis base or a Lewis acid, wherein the Lewis base may comprise any one or more of imidazole, boron trifluoride-amine complex, ethyltriphenyl phosphonium chloride, 2-methyl-imidazole (2MI), 2-phenyl-1H-imidazole (2PI), 2-ethyl-4-methylimidazole (2E4MI), triphenylphosphine (TPP) and 4-dimethylaminopyridine (DMAP); and the Lewis acid may comprise metal salt compounds, such as metal salt compounds of manganese, iron, cobalt, nickel, copper and zinc, such as zinc octanoate, cobalt octanoate, cobalt acetylacetonate or zinc acetylacetonate. Alternatively, the curing accelerator may be a peroxide capable of producing free radicals, including but not limited to dicumyl peroxide, tert-butyl peroxybenzoate, 2,5-dimethyl-2,5-di(t-butylperoxy)-3-hexyne and di(tert-butylperoxyisopropyl)benzene.

Unless otherwise specified, the aforesaid flame retardant is not particularly limited and may be any one or more flame retardants suitable for making a prepreg, a resin film, a resin-coated copper, a laminate or a printed circuit board, such as a phosphorous-containing flame retardant, preferably comprising at least one or more than one selected from the group consisting of ammonium polyphosphate, hydroquinone bis-(diphenyl phosphate), bisphenol A bis-(diphenylphosphate), tri(2-carboxyethyl)phosphine (TCEP), tri (chloroisopropyl)phosphate, trimethyl phosphate (TMP), dimethyl methyl phosphonate (DMMP), resorcinol bis(dixylenyl phosphate) (RDXP, such as PX-200, PX-201, and PX-202), phosphazene (such as SPB-100, SPH-100, and SPV-100), melamine polyphosphate, 9,10-dihydro-9-oxa-10-phosphaphenanthrene-10-oxide (DOPO) or its derivatives, melamine cyanurate and tri-hydroxy ethyl isocyanurate. For example, the flame retardant may be a DOPO compound, a DOPO resin (e.g. DOPO-HQ, DOPO-NQ, DOPO-PN, or DOPO-BPN), DOPO-linked epoxy resin, etc., wherein DOPO-PN is a DOPO-containing phenol novolac compound, DOPO-BPN may be a bisphenol novolac compound such as DOPO-BPAN (DOPO-bisphenol A novolac), DOPO-BPFN (DOPO-bisphenol F novolac) or DOPO-BPSN (DOPO-bisphenol S novolac).

Unless otherwise specified, the inorganic filler of the disclosure is not particularly limited and may be any one or more inorganic fillers suitable for making a prepreg, a resin film, a resin-coated copper, a laminate or a printed circuit board. Examples include but not limited to silica (fused, non-fused, porous or hollow type), aluminum oxide, aluminum hydroxide, magnesium oxide, magnesium hydroxide, calcium carbonate, aluminum nitride, boron nitride, aluminum silicon carbide, silicon carbide, titanium dioxide, zinc oxide, zirconium oxide, mica, boehmite (AlOOH), calcined talc, talc, silicon nitride and calcined kaolin. Moreover, the inorganic filler can be spherical, fibrous, plate-like, particulate, sheet-like or whisker-like in shape and can be optionally pretreated by a silane coupling agent.

The purpose of solvent is to alter the solid content of the resin composition and adjust the viscosity of the resin composition. Unless otherwise specified, the solvent used in the present disclosure is not particularly limited, and may be any one or more solvents suitable for dissolving or diluting the resin composition. Examples comprise but not limited to methanol, ethanol, ethylene glycol monomethyl ether, acetone, butanone (methyl ethyl ketone), methyl isobutyl ketone, cyclohexanone, toluene, xylene, methoxyethyl acetate, ethoxyethyl acetate, propoxyethyl acetate, ethyl acetate, dimethyl formamide, propylene glycol methyl ether or a mixture thereof.

Unless otherwise specified, the toughening agent of the disclosure is not particularly limited and may be any one or more toughening agents suitable for making a prepreg, a resin film, a resin-coated copper, a laminate or a printed circuit board. Examples include but not limited to rubber resin, carboxyl-terminated butadiene acrylonitrile rubber (CTBN rubber), core-shell rubber, etc.

Unless otherwise specified, the silane coupling agent of the disclosure is not particularly limited and may be any one or more silane coupling agents suitable for making a prepreg, a resin film, a resin-coated copper, a laminate or a printed circuit board. Examples include but not limited to silane compounds and siloxane compounds, which may be further categorized according to the functional groups into amino silane compounds, amino siloxane compounds, epoxy silane compounds, and epoxy siloxane compounds.

Furthermore, the present disclosure provides a product made from baking the above-described resin composition. The product may be a prepreg, a resin film, a resin-coated copper, a laminate or a printed circuit board.

In one embodiment, the product has a glass transition temperature (Tg) of 195° C. or greater, for example between 195° C. and 210° C., when being measured by a DMA (Dynamic Mechanical Analyzer) by reference to IPC-TM-650 2.4.24.4.

In one embodiment, the product has a T288 thermal resistance of greater than 60 minutes when being measured by a TMA (Thermomechanical Analyzer) by reference to IPC-TM-650 2.4.24.1.

In one embodiment, the product has a peel strength of 5.8 lb/in or greater, for example between 5.8 lb/in and 6.5 lb/in, for a half-ounce high-temperature elongation (HTE) copper foil when being measured by reference to IPC-TM-650 2.4.8.

In one embodiment, the product has a dielectric constant (Dk) of 3.70 or lower, for example between 3.60 and 3.70, when being measured by reference to JIS C2565 at a condition of 70% resin content and 2 GHz frequency. Dk@2 GHz refers to the dielectric constant measured at a 2 GHz frequency by using the method described in JIS C2565.

In one embodiment, the product has a dissipation factor (Df) of 0.0100 or lower, for example between 0.0080 and 0.0100, when being measured by reference to JIS C2565 at a condition of 70% resin content and 2 GHz frequency. Df@2 GHz refers to the dissipation factor measured at a 2 GHz frequency by using the method described in JIS C2565.

In one embodiment, the product has a dimensional change of 0.020% or lower, for example between 0.015% and 0.020%, after 260° C. reflow when being measured by reference to IPC-TM-650 2.4.39.

In one embodiment, if the product has been subjected to a horizontal black oxide process during production, the product has a number of cycle without delamination in solder dipping test of greater than 20 as measured by reference to IPC-TM-650 2.4.23.

In one embodiment, the product has a storage modulus of greater than 4000 GPa when being measured by DMA by reference to IPC-TM-650 2.4.24.4 and a stiffness of greater than 4000 N/m when being measured by DMA by reference to IPC-TM-650 2.4.24.4.

In one embodiment, the product has a difference in warpage height between 260° C. and 30° C. of less than 1000 μm.

In one embodiment, the product may pass a pressure cooking test (PCT), during which it is subjected to a moisture condition at 121° C. for 3 hours and then immersed into a solder bath with a constant temperature of 288° C. to observe the presence or absence of delamination after 20 seconds.

In one embodiment, the product subjected to a horizontal black oxide process may pass the pressure cooking test (PCT), wherein it is subjected to a moisture condition at 121° C. for 3 hours and then immersed into a solder bath with a constant temperature of 288° C. to observe the presence or absence of delamination after 20 seconds.

In this context, various above-cited IPC testing standards refer to the handbooks of various testing methods published by the Association Connecting Electronics Industries, which may be obtained from http://www.ipc.org.cn/Test-Methods.asp. The above-cited JIS testing standards refer to the handbooks of various testing methods published by the Japanese Industrial Standards Committee, which may be obtained from http://www.jisc.go.jp/app/JPS/JPSO0020.html.

DETAILED DESCRIPTION OF THE EMBODIMENTS

To enable those of ordinary skill in the art to realize the characteristics and functions of the present disclosure, terms and expressions used in the specification and the claims are provided with general descriptions and definitions below. Unless otherwise specified, all technical and scientific words or phases used herein have their plain meanings as known by those of ordinary skill in the art, and in case of conflict, the definitions of the present specification will control.

In this context, parameters such as numerical value, quantity or content of various components are generally expressed in a numerical value range or percentage range, but it should be noted that all features or conditions defined in a numerical value range or percentage range are merely for simplicity and convenience. Accordingly, the description of the numerical value range or percentage range should be understood to encompass and particularly disclose all possible subranges of the range and individual numerical values within the range, especially integer numerical values. For example, the description of a range of "1 to 8" should be understood that all subranges such as 1 to 7, 2 to 8, 2 to 6, 3 to 6, 4 to 8 and 3 to 8 have been particularly disclosed, especially subranges defined by the integer numerical values, and should be understood that individual numerical values such as 1, 2, 3, 4, 5, 6, 7 and 8 have been disclosed. Unless otherwise specified, the above interpretation method is suitable for all contents of the specification of the disclosure. In addition, if a range of numerical values is mentioned herein, unless otherwise indicated, the range should include its end points as well all integers and fractions within the range.

In this context, under the premise of achieving the purpose of the disclosure, the numerical values should be understood as having precisions of significant digits of the numerical values. For example, the digit 40.0 should be understood to encompass a range from 39.50 to 40.49, and so forth.

In this context, where features or embodiments of the disclosure are described in terms of Markush groups or alternative terms (for example, A, B or C), those of ordinary skill in the art will recognize that the disclosure is also described in terms of subgroups or any individual members or the combinations of all members within in the Markush group or list thereof.

The following detailed description is merely exemplary in nature and is not intended to limit the disclosure and its applications and uses. In addition, unless otherwise particularly indicated, the context is not limited by any theory described in the above prior arts or summary or the following detailed description of the embodiments, and all examples and comparative examples disclosed herein belong to a part of the disclosure regardless of its effects.

Resin Composition

The disclosure mainly relates to a resin composition, which at least includes the following four components: (A) epoxy resin, (B) oxydianiline type benzoxazine resin, (C) styrene-maleic anhydride resin and (D) tetra-phenol resin, and may optionally include other components, such as any one, two or a combination of more than two of the following components: polyphenylene ether resin, cyanate ester resin, isocyanurate resin, polyolefin resin, maleimide, polyester, amine curing agent, polyamide and polyimide. In addition, the resin composition may further include any one, two or a combination of more than two of the following additives: a curing accelerator, a flame retardant, an inorganic filler, a solvent, a toughening agent and a silane coupling agent.

Without being limited to the theory, components (B) oxydianiline type benzoxazine resin, (C) styrene-maleic anhydride resin and (D) tetra-phenol resin in the resin composition may interact and crosslink with each other at a certain condition (for example, at high temperature), and may also respectively crosslink with the (A) epoxy resin.

In the resin composition mentioned in the embodiment of the disclosure, preferred types, amounts and the like of the four main components and optional components added as required have been as previously described. The following further illustrates the application of the resin composition.

Resin Composition Product

Generally, the resin composition of the disclosure may be applicable to the industry of printed circuit boards but not limited thereto. For example, the resin composition may be formulated as a varnish, which is attached on a reinforcing material (such as glass fiber cloth) via various procedures, and then the components in the resin composition are subjected to reactions and formation change (such as semi-cured or cured) through high-temperature baking to product a product.

Embodiments of the above product include, but not limited to, a prepreg, a resin film, a resin-coated copper, a laminate or a printed circuit board.

Particularly, an embodiment of the disclosure provides a prepreg, which has a reinforcing material and a layered article disposed on the reinforcing material, wherein the layered article is made from the resin composition via semi-curing to B-stage. By employing the above resin composition, the laminate made from the prepreg of the disclosure may satisfy one or more or all of desirable characteristics such as high dimensional stability after a reflow process, better thermal resistance after a horizontal black oxide process, low dielectric constant, low dissipation factor, high thermal resistance and flame retardancy.

The resin composition may be attached onto the reinforcing material by means of impregnation, and then heated at a high temperature to a semi-cured state to form the prepreg. The reinforcing material suitable for the disclosure may include a fiber material, a woven fabric and a non-woven fabric, such as a glass fiber cloth, the function of which is mainly to increase the mechanical strength of the prepreg. Preferably, the reinforcing material may be optionally pretreated by a silane coupling agent.

The above prepreg may be cured to form a C-staged sheet or a solid-state insulating layer via high-temperature heating or high-temperature and high-pressure heating, and if the resin composition contains a solvent, the solvent may be removed by volatilization during the high-temperature heating process.

The disclosure further provides a resin film, which is made from semi-curing the above resin composition after heating by baking. For example, the resin composition may be selectively coated onto a polyethylene terephthalate film (PET film) or a polyimide film (PI film), and then cured to form the resin film after heating by baking. A laminate made from the resin film may satisfy one or more or all of desirable characteristics such as high dimensional stability after a reflow process, better thermal resistance after a horizontal black oxide process, low dielectric constant, low dissipation factor, high thermal resistance and flame retardancy.

The disclosure further provides a resin-coated copper (RCC), which is obtained by coating the resin varnish of the above resin composition on a copper foil or a PI film of a PI film-coated copper foil and heating to a semi-cured state at a high temperature. The resin-coated copper, which is obtained by coating the resin varnish on the PI film of the PI film-coated copper foil and baking to the semi-cured state, is also referred to as a flexible resin-coated copper.

The disclosure further provides a laminate, which includes at least two metal layers and an insulating layer disposed between the metal layers, wherein the insulating layer may be made from sandwiching the above prepreg or resin film between the metal layers and curing by high-temperature and high-pressure treatment. The metal layers may be made from materials such as copper, aluminum, nickel, platinum, silver, gold or an alloy thereof, but not limited thereto, and is preferably made from a copper foil. The above laminate may be for example a copper-clad laminate (CCL).

By employing the above resin composition, the laminate has the advantages of low dielectric constant, low dissipation factor, high thermal resistance and/or flame retardancy, particularly high dimensional stability after a reflow process and better thermal resistance after a horizontal black oxide process, so as to be especially suitable for a circuit board for high-speed and high-frequency signal transmission. Therefore, the above laminate may be further processed in accordance with various circuit board processes known in the art to form a printed circuit board, and the printed circuit board may be jointed with an electronic assembly so as to operate at severe environments such as high temperature and high humidity without influencing its quality.

Embodiment: Constitution of Resin Composition

Example resin compositions and comparative example resin compositions are respectively prepared in accordance with compositions of Table 1-1 to Table 2-2 as below. A blank column in the tables represents that the composition does not include the component.

TABLE 1-1

| Example Resin Compositions (Unit: Parts by Weight) | | | | | | | | |
|---|---|---|---|---|---|---|---|---|
| Component | | | E1 | E2 | E3 | E4 | E5 | E6 |
| Epoxy Resin | Dicyclopentadiene Epoxy Resin | HP-7200H | 30 | | 50 | 25 | 30 | 30 |
| | Biphenyl Novolac Epoxy Resin | NC-3000 | | 30 | | 25 | | |
| | Phenol Novolac Epoxy Resin | PNE-177 | 70 | | 25 | 25 | 70 | 70 |
| | Naphthol-type Epoxy Resin | HP-9900 | | 70 | 25 | 25 | | |
| Benzoxazine Resin | Oxydianiline Benzoxazine Resin | PF 3500 | 30 | 30 | 30 | 30 | 20 | 70 |
| | Bisphenol F type Benzoxazine Resin | LZ 8280 | | | | | | |
| | Bisphenol A type Benzoxazine Resin | LZ 8290 | | | | | | |
| | Phenolphthalein type Benzoxazine Resin | MT 35800 | | | | | | |
| Styrene-Maleic Anhydride | SMA | EF-30 | | | | | | |
| | | SMA 2000 | | | | | | |
| | | EF-40 | 15 | 15 | 15 | 15 | 15 | 15 |
| | | EF-60 | | | | | | |
| | | EF-80 | | | | | | |
| Phenol Curing Agent | Tetra-Phenol | TPN1 | 10 | 10 | 10 | 10 | 10 | 10 |
| | Dicyclopentadiene Phenol Resin | PD-9110 | | | | | | |
| | Phenol Novolac Resin | TD-2090 | | | | | | |

TABLE 1-1-continued

Example Resin Compositions (Unit: Parts by Weight)

| | Component | | E1 | E2 | E3 | E4 | E5 | E6 |
|---|---|---|---|---|---|---|---|---|
| Inorganic Filler | Fused Silica | Fused silica | 50 | 50 | 50 | 50 | 50 | 50 |
| Catalyst | 2-ethyl-4-methyl imidazole | 2E4MI | 0.3 | 0.3 | 0.3 | 0.3 | 0.3 | 0.3 |
| Solvent | Butanone | MEK | 60 | 60 | 60 | 60 | 60 | 60 |

TABLE 1-2

Example Resin Compositions (Unit: Parts by Weight)

| | Component | | E7 | E8 | E9 | E10 | E11 | E12 | E13 | E14 |
|---|---|---|---|---|---|---|---|---|---|---|
| Epoxy Resin | Dicyclopentadiene Epoxy Resin | HP-7200H | 30 | 30 | 30 | 30 | 30 | 30 | 30 | 30 |
| | Biphenyl Novolac Epoxy Resin | NC-3000 | | | | | | | | |
| | Phenol Novolac Epoxy Resin | PNE-177 | 70 | 70 | 70 | 70 | 70 | 70 | 70 | 70 |
| | Naphthol-type Epoxy Resin | HP-9900 | | | | | | | | |
| Benzoxazine Resin | Oxydianiline Benzoxazine Resin | PF 3500 | 30 | 30 | 30 | 30 | 30 | 30 | 20 | 70 |
| | Bisphenol F type Benzoxazine Resin | LZ 8280 | | | | | | | | |
| | Bisphenol A type Benzoxazine Resin | LZ 8290 | | | | | | | | |
| | Phenolphthalein type Benzoxazine Resin | MT 35800 | | | | | | | | |
| Styrene-Maleic Anhydride | SMA | EF-30 | | | | 20 | | | 5 | 10 |
| | | SMA 2000 | 45 | | | 25 | | | 5 | 20 |
| | | EF-40 | | 60 | | | 15 | 15 | 5 | 30 |
| | | EF-60 | | | 30 | | | | | |
| | | EF-80 | | | 30 | | | | | |
| Phenol Curing Agent | Tetra-Phenol | TPN1 | 10 | 10 | 10 | 10 | 3 | 15 | 15 | 3 |
| | Dicyclopentadiene Phenol Resin | PD-9110 | | | | | | | | |
| | Phenol Novolac Resin | TD-2090 | | | | | | | | |
| Inorganic Filler | Fused Silica | Fused silica | 50 | 50 | 50 | 50 | 50 | 50 | 50 | 50 |
| Catalyst | 2-ethyl-4-methyl imidazole | 2E4MI | 0.3 | 0.3 | 0.3 | 0.3 | 0.3 | 0.3 | 0.3 | 0.3 |
| Solvent | Butanone | MEK | 60 | 60 | 60 | 60 | 60 | 60 | 60 | 60 |

TABLE 2-1

Comparative Example Resin Compositions (Unit: Parts by Weight)

| | Component | | C1 | C2 | C3 | C4 | C5 | C6 |
|---|---|---|---|---|---|---|---|---|
| Epoxy Resin | Dicyclopentadiene Epoxy Resin | HP-7200H | 30 | 30 | 30 | 30 | 30 | 30 |
| | Biphenyl Novolac Epoxy Resin | NC-3000 | | | | | | |
| | Phenol Novolac Epoxy Resin | PNE-177 | 70 | 70 | 70 | 70 | 70 | 70 |
| | Naphthol-type Epoxy Resin | HP-9900 | | | | | | |
| Benzoxazine Resin | Oxydianiline Benzoxazine Resin | PF 3500 | 10 | 90 | | | | |
| | Bisphenol F type Benzoxazine Resin | LZ 8280 | | | | 30 | | |
| | Bisphenol A type Benzoxazine Resin | LZ 8290 | | | | | 30 | |
| | Phenolphthalein type Benzoxazine Resin | MT 35800 | | | | | | 30 |

TABLE 2-1-continued

Comparative Example Resin Compositions (Unit: Parts by Weight)

| | Component | | C1 | C2 | C3 | C4 | C5 | C6 |
|---|---|---|---|---|---|---|---|---|
| Styrene-Maleic Anhydride | SMA | EF-30 | | | | | | |
| | | SMA 2000 | | | | | | |
| | | EF-40 | 15 | 15 | 15 | 15 | 15 | 15 |
| | | EF-60 | | | | | | |
| | | EF-80 | | | | | | |
| Phenol Curing Agent | Tetra-Phenol | TPN1 | 10 | 10 | 10 | 10 | 10 | 10 |
| | Dicyclopentadiene Phenol Resin | PD-9110 | | | | | | |
| | Phenol Novolac Resin | TD-2090 | | | | | | |
| Inorganic Filler | Fused Silica | Fused silica | 50 | 50 | 50 | 50 | 50 | 50 |
| Catalyst | 2-ethyl-4-methyl imidazole | 2E4MI | 0.3 | 0.3 | 0.3 | 0.3 | 0.3 | 0.3 |
| Solvent | Butanone | MEK | 60 | 60 | 60 | 60 | 60 | 60 |

TABLE 2-2

Comparative Example Resin Compositions (Unit: Parts by Weight)

| | Component | | C7 | C8 | C9 | C10 | C11 | C12 | C13 |
|---|---|---|---|---|---|---|---|---|---|
| Epoxy Resin | Dicyclopentadiene Epoxy Resin | HP-7200H | 30 | 30 | 30 | 30 | 30 | 30 | 30 |
| | Biphenyl Novolac Epoxy Resin | NC-3000 | | | | | | | |
| | Phenol Novolac Epoxy Resin | PNE-177 | 70 | 70 | 70 | 70 | 70 | 70 | 70 |
| | Naphthol-type Epoxy Resin | HP-9900 | | | | | | | |
| Benzoxazine Resin | Oxydianiline Benzoxazine Resin | PF 3500 | 30 | 30 | 30 | 30 | 30 | 30 | |
| | Bisphenol F type Benzoxazine Resin | LZ 8280 | | | | | | | 30 |
| | Bisphenol A type Benzoxazine Resin | LZ 8290 | | | | | | | |
| | Phenolphthalein type Benzoxazine Resin | MT 35800 | | | | | | | |
| Styrene-Maleic Anhydride | SMA | EF-30 | | | | | | | |
| | | SMA 2000 | | | | | | | |
| | | EF-40 | 5 | 70 | 15 | 15 | 15 | 15 | 15 |
| | | EF-60 | | | | | | | |
| | | EF-80 | | | | | | | |
| Phenol Curing Agent | Tetra-Phenol | TPN1 | 10 | 10 | 20 | | | | |
| | Dicyclopentadiene Phenol Resin | PD-9110 | | | | | 10 | | |
| | Phenol Novolac Resin | TD-2090 | | | | | | 10 | 10 |
| Inorganic Filler | Fused Silica | Fused silica | 50 | 50 | 50 | 50 | 50 | 50 | 50 |
| Catalyst | 2-ethyl-4-methyl imidazole | 2E4MI | 0.3 | 0.3 | 0.3 | 0.3 | 0.3 | 0.3 | 0.3 |
| Solvent | Butanone | MEK | 60 | 60 | 60 | 60 | 60 | 60 | 60 |

In various example resin compositions and comparative example resin compositions as above, trade names or ID codes of the components are as below:

HP-7200H: dicyclopentadiene phenolic epoxy resin, available from D.I.C.

NC-3000: biphenyl novolac epoxy resin, available from Nippon Kayaku

PNE-177: phenol novolac epoxy resin, available from Chang Chun Plastics Co., Ltd.

HP-9900: naphthol-type epoxy resin, available from D.I.C.

PF 3500: oxydianiline type benzoxazine resin, available from Chang Chun Plastics Co., Ltd.

LZ 8280: bisphenol F type benzoxazine resin, available from Huntsman

LZ 8290: bisphenol A type benzoxazine resin, available from Huntsman

MT 35800: phenolphthalein type benzoxazine resin, available from Huntsman

EF-30: styrene-maleic anhydride copolymer (styrene:maleic anhydride=3:1), available from Cray valley SMA-2000: styrene-maleic anhydride copolymer (styrene:maleic anhydride=2:1), available from Cray valley EF-40: styrene-maleic anhydride copolymer (styrene:maleic anhydride=4:1), available from Cray valley EF-60: styrene-maleic anhydride copolymer (styrene:maleic anhydride=6:1), available from Cray valley EF-80: styrene-maleic anhydride copolymer (styrene:maleic anhydride=8:1), available from Cray valley TPN1: tetra-phenol, available from Nan Ya Plastics Corp.

PD-9110: dicyclopentadiene phenol resin, available from Chang Chun Plastics Co., Ltd.

TD-2090: phenol novolac resin, available from D.I.C.

Fused silica: fused silica, available from Sibelco 2E4MI: 2-ethyl-4-methylimidazole, available from SHIKOKU MEK: butanone Embodiment: Product Made From the Resin Composition According to the above formulations, various products or specimens were made by reference to the following procedures.

1. Prepregs

Resin varnishes prepared from different resin compositions (example resin compositions E1 to E14 and comparative example resin compositions C1 to C13) were used for impregnating fiberglass clothes of different specifications (such as 106, 1067, 2116 or 7628), and then subjected to heating at a high temperature of 180° C. to 205° C. to a semi-cured state to obtain the prepregs with required resin contents (RC).

The prepregs with specifications as below were respectively obtained: RC=55% (2116 fiberglass cloth), RC=48% (2116 fiberglass cloth), RC=70% (106 fiberglass cloth), RC=42% (7268 fiberglass cloth) and RC=69% (1067 fiberglass cloth).

2. Copper-Clad Laminates (Four Plies)

Two half-ounce (oz) (a thickness of 18 micrometers) HTE (High-Temperature Elongation) copper foils and four prepregs (2116 fiberglass cloth) prepared from respective specimens were prepared, wherein the resin content of each prepreg is about 55%. The copper foil, the four prepregs and the copper foil were sequentially superimposed and sandwiched and subjected to a lamination process under vacuum at 195° C. for 2 hours to form various copper-clad laminates, in which the four prepregs mutually superimposed and sandwiched were cured to form insulation layers between the two copper foils. The resin content of the insulation layers is about 55%.

3. Copper-Free Laminates (Four Plies)

Each of the above copper-clad laminates (four plies) was etched to remove the copper foils so as to obtain a copper-free laminate (four plies), which comprises four prepregs laminated together and has a resin content of about 55%.

4. Copper-Free Laminates (Two Plies)

Two 0.5 oz HTE copper foils and two prepregs (106 fiberglass cloth) obtained from respective specimens were prepared. The resin content of each prepreg is about 70%. The two prepregs were superimposed and sandwiched between the copper foils and subjected to a lamination process under vacuum at 195° C. for 2 hours to form a copper-clad laminate (two plies). Next, each copper-clad laminate was etched to remove the two copper foils to obtain a copper-free laminate (two plies), which comprises two prepregs laminated together and has a resin content of about 70%.

5. Copper-Free Laminates (Eight Plies)

Two 0.5 oz HTE copper foils and eight prepregs (2116 fiberglass cloth) obtained from respective specimens were prepared. The resin content of each prepreg is about 48%. The eight prepregs were superimposed and sandwiched between the copper foils and subjected to a lamination process under vacuum at 195° C. for 2 hours to form a copper-clad laminate. Next, each copper-clad laminate was etched to remove the two copper foils to obtain a copper-free laminate (eight plies), which comprises eight prepregs laminated together and has a thickness of insulation layers of 0.82 mm.

6. Laminates (Including Copper Foils) After Horizontal Black Oxide Process

A core was firstly made by using the following procedures: three first prepregs (for example EM-827 available from Elite Material Co., Ltd., using 7628 fiberglass cloth, RC=42%) were prepared, and the three superimposed first prepregs were overlapped with a 0.5 oz HTE (High-Temperature Elongation) copper foil at two sides and then subjected to lamination and curing processes under vacuum at a high temperature (195° C.) and a high pressure (360 psi) for 2 hours to form a copper-clad core (with a thickness of 20 mil). The core was subjected to a horizontal black oxide process to obtain a horizontal black oxide core; two sides of the horizontal black oxide core were respectively superimposed with a prepreg (e.g. the two prepregs may be obtained from the same example resin composition or the same comparative example resin composition (1067 fiberglass cloth), each having a resin content of about 69%), and outmost layers of the two prepregs were respectively superimposed with a 0.5 oz HTE copper foil according to the following sequence: copper foil, prepreg, horizontal black oxide core, prepreg and copper foil, which were then subjected to a lamination process under vacuum at 195° C. for 2 hours to form a copper-clad, horizontal black oxide laminate.

Property analysis was performed on the above products or specimens in accordance with the following procedures.

1. Glass Transition Temperature (Tg) Measurement

In the glass transition temperature measurement, the copper-free laminates (four plies) were tested by employing a dynamic mechanical analyzer (DMA) by reference to the processes described in IPC-TM-650 2.4.24.4: Glass Transition and Modulus of Materials Used in High Density Interconnection (HDI) and Microvias-DMA Method.

2. Solder Dipping (S/D) Test After Horizontal Black Oxide Process

In the solder dipping measurement, the horizontal black oxide copper-clad laminates were tested by reference to the processes described in IPC-TM-650 2.4.23: Soldering Resistance of Laminate Materials, wherein each specimen was immersed in a solder bath with a constant temperature set to 288° C. for 10 seconds and then removed therefrom and placed at room temperature for about 10 seconds. The specimen was then re-immersed in the solder bath for 10 seconds and removed therefrom and placed at room temperature for about 10 seconds. The steps were repeated, and the number of cycles to delamination of each specimen was recorded. Generally, greater number of cycles to delamination in the solder dipping test represents higher thermal resistance of the product (such as a copper-clad laminate) made from the resin composition.

3. PCT Test of Copper-Free Laminates After Horizontal Black Oxide Process

A copper-free laminate after a horizontal black oxide process was taken out after it has been subjected to 3-hour moisture absorption at a temperature of 121° C., immersed in a solder bath with a constant temperature of 288° C., and taken out after being immersed for 20 seconds to observe the presence or absence of delamination. Pressure cooking test (PCT) of each sample was conducted by reference to IPC-TM-650 2.6.16.1.

4. Thermal Resistance (T288) Test

In the T288 thermal resistance measurement, the copper-clad laminates were tested at a constant temperature 288° C. by using a thermomechanical analyzer (TMA) by reference to the processes described in IPC-TM-650 2.4.24.1: Time to Delamination (TMA Method), wherein the time to delamination of the copper-clad laminates was recorded.

5. Dielectric Constant (Dk) and Dissipation Factor (Df) Measurement

In the dielectric constant and dissipation factor measurement, the copper-free laminates (two plies) were used as specimens, each of which was measured by employing a microwave dielectrometer commercially available from AET Inc. by reference to the processes described in JIS C2565: Measuring Methods for Ferrite Cores for Microwave Device, at a 2 GHz frequency. Lower dielectric constant and lower dissipation factor represent a better dielectric property of the specimens. A difference greater than 0.05 in Dk represents a significant difference in dielectric constants of different laminates, and a difference greater than 0.0005 in Df represents a significant difference in dissipation factor of different laminates.

6. PCT Test of Copper-Free Laminates

A copper-free laminate was taken out after it has been subjected to 3-hour moisture absorption at a temperature of 121° C., immersed in a solder bath with a constant temperature of 288° C., and taken out after being immersed for 20 seconds to observe the presence or absence of delamination. Pressure cooking test (PCT) of each sample was conducted by reference to IPC-TM-650 2.6.16.1.

7. Peel Strength (P/S) Test of Laminates to Copper Foils

A 0.5 oz copper foil was used to measure the peel strength of a laminate to the copper foil by reference to IPC-TM-650 2.4.8: Peel Strength of Metallic Clad Laminate, with a unit of lb/in.

8. Shrinkage After Reflow Test of Laminates

In the dimensional stability test, outer layers of two prepregs (2116 fiberglass cloth) were superimposed with a 0.5 oz HTE copper foil at two sides; according to sequence of copper foil, prepreg, prepreg, and copper foil, lamination was performed under vacuum at 210° C. for 2 hours to form a copper-clad laminate with a thickness of 10 mil, which was used as a specimen measured by using a three-dimensional measuring instrument by reference to the processes described in IPC-TM-650 2.4.39: Dimensional Stability, Glass Reinforced Thin Laminates, wherein the copper-free laminate with copper foil etched (before reflow) was firstly tested, and then the copper-free laminate after etching was tested (after reflow) after being reflowed at 260° C. for a cycle. With respect to the test results, the difference of the present method and IPC-TM-650 2.4.39 is that this test method measures the dimensional change before reflow and after reflow. Lower reflow dimensional shrinkage represents better laminate properties.

Particularly, the reflow dimensional shrinkage is a dimensional change before and after reflow (one cycle) of the copper-free laminate, with a unit of %. The calculation equation of the reflow dimensional change is as below: ((dimension of copper-free laminate after reflow−dimension of copper-free laminate before reflow)/dimension of copper-free laminate before reflow)×100%.

9. Storage Modulus Test

The storage modulus of the copper-free laminate (eight plies) was measured by using DMA by reference to the processes described in IPC-TM-650 2.4.24.4: Glass Transition and Modulus of Materials Used in High Density Interconnection (HDI) and Micro vias-DMA Method, with a unit of GPa.

10. Stiffness Test

The stiffness of the copper-free laminate (eight plies) was measured by using DMA by reference to the processes described in IPC-TM-650 2.4.24.4 Glass Transition and Modulus of Materials Used in High Density Interconnection (HDI) and Micro vias-DMA Method, with a unit of N/m.

11. Warpage Test

Warpage height was further measured with respect to the products made from the resin compositions of E1, E13, E14 and C13 by reference to the method as below.

A core was made from the resin composition of the example E1 by using the following procedure: a prepreg was prepared from the resin composition E1 as the first prepreg (using 1078 fiberglass cloth); the first prepreg was superimposed with a 0.5 oz HTE copper foil at two sides and subjected to lamination and curing in vacuum at a high temperature (195° C.) and a high pressure (360 psi) for 2 hours to form a copper clad laminate; patterns were formed on the surfaces of the copper foils (such as conventional exposure, photolithography and etching processes) to obtain the core with a thickness of about 2.4 mil (0.06096 mm).

The layer build-up step was performed by using the following procedure: after obtaining the above core, a second prepreg was prepared respectively from each example and comparative example resin compositions using 1067 fiberglass cloth with RC=67%; the core was superimposed with one second prepreg at two sides, and each prepreg was then superimposed with a 0.5 oz HTE copper foil at the side opposite to the core, and subjected to lamination and curing processes under vacuum at a high temperature (195° C.) and a high pressure (360 psi) for 2 hours to complete first lamination, followed by a drilling process to make alignment holes, and then an in-hole metallization process and a pattern formation process to complete a first build-up step to form a four-ply laminate.

The layer build-up step was repeated to form a six-ply laminate (second build-up, second lamination) and an eight-ply laminate (third build-up, third lamination) until a ten-ply laminate (fourth build-up, fourth lamination) is formed.

The above ten-ply laminate (150 mm in length and 78 mm in width) was subjected to a reflow process by using a TherMoire instrument available from the Akrometrix Inc. by reference to the disclosed Full-field Signed Warpage testing method. In the process, the temperature was firstly increased to 260° C. from 30° C., and then an average warpage of the ten-ply laminate at 260° C. and 30° C. was measured; the difference between the two is a warpage height difference (i.e. warpage) of the example E1, with a unit of μm.

The warpage height differences of E13, E14 and C13 were respectively measured by the above preparation method and testing method.

Test results of the aforesaid items No. 1 to 11 are shown as Table 3 to Table 5-2.

TABLE 3

Test Results for Storage Modulus, Stiffness and Warpage

| Laminate Property | Unit | E1 | E13 | E14 | C13 |
|---|---|---|---|---|---|
| Storage Modulus | Gpa | 5476 | 5400 | 6500 | 3505 |
| Stiffness | N/m | 6509 | 6450 | 7450 | 3664 |
| Warpage | μm | (−)465 | (−)470 | (−)398 | (−)1674 |

TABLE 4-1

Test Results for Example Laminate Property

| Laminate Property | Test Item (Method) | Unit | E1 | E2 | E3 | E4 | E5 | E6 |
|---|---|---|---|---|---|---|---|---|
| Glass Transition Temperature (Tg) | DMA | °C. | 200 | 210 | 195 | 197 | 196 | 210 |
| Shrinkage of Laminate after Reflow | Three-dimensional | % | 0.015 | 0.020 | 0.018 | 0.020 | 0.018 | 0.018 |
| T288 | TMA | Minute | >60 | >60 | >60 | >60 | >60 | >60 |
| Solder Dipping Thermal Resistance after Horizontal Black Oxide Process | S/D after Black Oxide PCT (2 atm, 3 hours) | cycle N/A | >20 pass | >20 pass | >20 pass | >20 pass | >20 pass | >20 pass |
| Peel Strength | 0.5 oz HTE copper foil | lb/in | 6.3 | 6.0 | 6.3 | 6.2 | 6.0 | 6.5 |
| PCT | PCT (2 atm, 3 hours) | N/A | pass | pass | pass | pass | pass | pass |
| Dielectric Constant | Dk@2 GHz | N/A | 3.60 | 3.70 | 3.60 | 3.65 | 3.60 | 3.70 |
| Dissipation Factor | Df@2 GHz | N/A | 0.0090 | 0.0100 | 0.0090 | 0.0100 | 0.0090 | 0.0100 |

TABLE 4-2

Test Results for Example Laminate Property

| Laminate Property | Test Item (Method) | Unit | E7 | E8 | E9 | E10 | E11 | E12 |
|---|---|---|---|---|---|---|---|---|
| Glass Transition Temperature (Tg) | DMA | °C. | 197 | 195 | 195 | 197 | 198 | 205 |
| Shrinkage of Laminate after Reflow | Three-dimensional | % | 0.018 | 0.020 | 0.020 | 0.018 | 0.015 | 0.015 |
| T288 | TMA | Minute | >60 | >60 | >60 | >60 | >60 | >60 |
| Solder Dipping Thermal Resistance after Horizontal Black Oxide Process | S/D after Black Oxide PCT (2 atm, 3 hours) | cycle N/A | >20 pass | >20 pass | >20 pass | >20 pass | >20 pass | >20 pass |
| Peel Strength | 0.5 oz HTE copper foil | lb/in | 6.1 | 5.8 | 5.8 | 6.1 | 6.3 | 6.3 |
| PCT | PCT (2 atm, 3 hours) | N/A | pass | pass | pass | pass | pass | pass |
| Dielectric Constant | Dk@2 GHz | N/A | 3.60 | 3.60 | 3.60 | 3.60 | 3.60 | 3.60 |
| Dissipation Factor | Df@2 GHz | N/A | 0.0090 | 0.0080 | 0.0080 | 0.0090 | 0.0090 | 0.0090 |

TABLE 5-1

Test Results for Comparative Example Laminate Property

| Laminate Property | Test Item (Method) | Unit | C1 | C2 | C3 | C4 | C5 | C6 |
|---|---|---|---|---|---|---|---|---|
| Glass Transition Temperature (Tg) | DMA | °C. | 190 | 210 | 190 | 195 | 190 | 200 |
| Shrinkage of Laminate after Reflow | Three-dimensional | % | 0.028 | 0.025 | 0.037 | 0.035 | 0.035 | 0.037 |
| T288 | TMA | Minute | 45 | 50 | 30 | 50 | 40 | 40 |
| Solder Dipping Thermal Resistance after Horizontal Black Oxide Process | S/D after Black Oxide PCT (2 atm, 3 hours) | cycle N/A | 15 fail | 12 fail | 10 fail | 15 fail | 13 fail | 10 fail |

TABLE 5-1-continued

Test Results for Comparative Example Laminate Property

| Laminate Property | Test Item (Method) | Unit | C1 | C2 | C3 | C4 | C5 | C6 |
|---|---|---|---|---|---|---|---|---|
| Peel Strength | 0.5 oz HTE copper foil | lb/in | 5.5 | 6.5 | 4.5 | 5.6 | 5.6 | 6.0 |
| PCT | PCT (2 atm, 3 hours) | N/A | pass | pass | fail | pass | pass | fail |
| Dielectric Constant | Dk@2 GHz | N/A | 3.60 | 3.70 | 3.65 | 3.60 | 3.60 | 3.70 |
| Dissipation Factor | Df@2 GHz | N/A | 0.0110 | 0.0110 | 0.0110 | 0.0090 | 0.0090 | 0.0100 |

TABLE 5-2

Test Results for Comparative Example Laminate Property

| Laminate Property | Test Item (Method) | Unit | C7 | C8 | C9 | C10 | C11 | C12 |
|---|---|---|---|---|---|---|---|---|
| Glass Transition Temperature (Tg) | DMA | °C. | 200 | 190 | 200 | 195 | 190 | 195 |
| Shrinkage of Laminate after Reflow | Three-dimensional | % | 0.020 | 0.020 | 0.020 | 0.020 | 0.020 | 0.020 |
| T288 | TMA | Minute | 30 | 10 | 40 | 50 | 30 | 30 |
| Solder Dipping Thermal Resistance after Horizontal Black Oxide Process | S/D after Black Oxide | cycle | 15 | 10 | 15 | 10 | 8 | 12 |
| | PCT (2 atm, 3 hours) | N/A | fail | fail | fail | fail | fail | fail |
| Peel Strength | 0.5 oz HTE copper foil | lb/in | 6.5 | 5.2 | 6.2 | 6.2 | 6.2 | 6.2 |
| PCT | PCT (2 atm, 3 hours) | N/A | fail | fail | fail | fail | fail | fail |
| Dielectric Constant | Dk@2 GHz | N/A | 3.70 | 3.60 | 3.70 | 3.60 | 3.60 | 3.60 |
| Dissipation Factor | Df@2 GHz | N/A | 0.0110 | 0.0090 | 0.0100 | 0.0090 | 0.0090 | 0.0100 |

From the above test results for various properties, it may be clearly found that laminates employing the technical solution of the disclosure have properties superior to those of other technical solutions. It is more surprisingly found that the resin composition of the disclosure also shows excellent stiffness and higher storage modulus in addition to better dimensional stability after reflow and better thermal resistance after a horizontal black oxide process, and smaller warpage after reflow represents smaller deformation of the laminate.

With regard of Table 3, it may be found that compared with the comparative example C13, the example E1 has a higher storage modulus and a higher stiffness and a lower warpage than that of the comparative example C13. Similarly, it may be observed that compared with the comparative example C13, the examples E13 and E14 have higher storage modulus, higher stiffness and lower warpage, which indicates that the technical solution of the present disclosure may achieve higher structure stability.

In addition, with respect to other laminate properties, by reference to Tables 4-1 to 5-2, the following observations can be made:

1. The examples E1 to E6 all achieve unexpected better overall properties in all test items. Compared with the examples E1 to E6, the comparative examples C1 and C2 also include four major components, although some properties achieve testing requirements, other properties (such as T288 and thermal resistance after a horizontal black oxide process) are inferior to those of the examples E1 to E6 because amounts used are not within an optimal range.

2. The comparative examples C3 to C6 do not include benzoxazine resin or employ other types of benzoxazine resin; it may be observed that the resin after reflow has high dimensional change and relatively poor thermal resistance.

3. The examples E7 to E10 achieve unexpected better overall properties in all test items by employing different kinds of styrene maleic anhydride or a combination thereof as well. In contrast, the comparative examples C7 and C8 have some properties (such as T288, thermal resistance after a horizontal black oxide process, and PCT) inferior to those of E7 to E10 because the amount of styrene-maleic anhydride is not within an optimal range.

4. Compared with the comparative examples C10 and C9 respectively, it may be found that, for the examples E11 and E12, if the amount of the tetra-phenol is within a specific range, unexpected better overall properties may be achieved; when no tetra-phenol exists or the amount thereof is not within the specific range, some properties (such as T288, thermal resistance after a horizontal black oxide process, and PCT) are not so satisfactory.

5. By reference to the comparative examples C11 and C12, it may be found that when other types of phenol curing agents, such as dicyclopentadiene phenol resin PD-9110 or common phenol novolac resin TD-2090, are employed, some properties (such as T288, thermal resistance after a horizontal black oxide process, and PCT) may not achieve unexpected improvements.

The above detailed description is merely for purpose of explanation, and is not intended to limit the embodiments of the application or applications or uses of these embodiments. In addition, although at least one exemplary embodiment has been presented in the above detailed description, it should be understood that the disclosure may still have a large number of variations. Similarly, it should be understood that the embodiments described herein are not intended to limit the range, the use or the configuration of the claimed subject matter. Instead, the above detailed description may serve as a simple and convenient guide to those of ordinary skill in the art to implement the one or more embodiments. Moreover, the scope of the present disclosure includes known equivalents and all foreseeable equivalents at the time when this application is filed.

What is claimed is:

1. A resin composition, comprising epoxy resin, oxydianiline type benzoxazine resin, styrene-maleic anhydride resin and tetra-phenol resin, wherein the resin composition comprises 100 parts by weight of the epoxy resin, 20 to 70 parts by weight of the oxydianiline type benzoxazine resin, 15 to 60 parts by weight of the styrene-maleic anhydride resin and 3 to 15 parts by weight of the tetra-phenol resin.

2. The resin composition of claim 1, wherein a molar ratio of styrene to maleic anhydride in the styrene-maleic anhydride resin is 1:1, 2:1, 3:1, 4:1, 6:1, 8:1 or 12:1.

3. The resin composition of claim 1, wherein the epoxy resin is selected from one or a combination of two or more of the following group: bisphenol A epoxy resin, bisphenol F epoxy resin, bisphenol S epoxy resin, bisphenol AD epoxy resin, phenol novolac epoxy resin, trifunctional epoxy resin, tetrafunctional epoxy resin, multifunctional epoxy resin, dicyclopentadiene epoxy resin, phosphorus-containing epoxy resin, p-xylene epoxy resin, naphthalene epoxy resin, benzofuran epoxy resin and isocyanurate-modified epoxy resin.

4. The resin composition of claim 3, wherein the phenol novolac epoxy resin comprises bisphenol A novolac epoxy resin, bisphenol F novolac epoxy resin, biphenyl novolac epoxy resin, phenol benzaldehyde epoxy resin, phenol aralkyl novolac epoxy resin or o-cresol novolac epoxy resin.

5. The resin composition of claim 3, wherein the phosphorus-containing epoxy resin comprises 9,10-dihydro-9-oxa-10-phosphaphenanthrene-10-oxide (DOPO)-containing epoxy resin or 2 (10H-9-oxa-10-phospha-1-phenanthryl) hydroquinone phosphorus oxide (DOPO-HQ)-containing epoxy resin; the DOPO-containing epoxy resin is selected from one or more than one of DOPO-containing phenolic novolac epoxy resin, DOPO-containing cresol novolac epoxy resin and DOPO-containing bisphenol A novolac epoxy resin; and the DOPO-HQ-containing epoxy resin is selected from one or more than one of DOPO-HQ-containing phenolic novolac epoxy resin, DOPO-HQ-containing cresol novolac epoxy resin and DOPO-HQ-containing bisphenol A novolac epoxy resin.

6. The resin composition of claim 1, wherein the tetra-phenol resin is represented by the following structure:

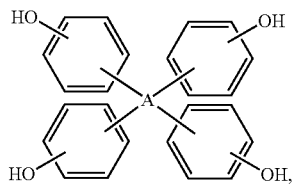

wherein A is an alkylene with a carbon number of 2 to 6.

7. The resin composition of claim 1, wherein the tetra-phenol resin is represented by the following structure:

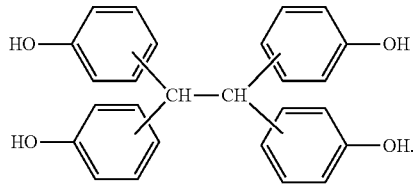

8. The resin composition of claim 7, wherein the tetra-phenol resin is represented by the following structure:

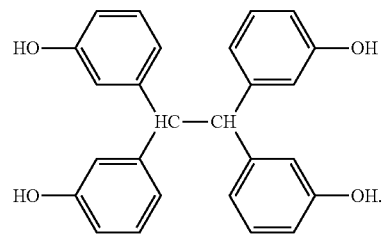 [SMILES: Oc1cccc(C(c2cccc(O)c2)C(c2cccc(O)c2)c2cccc(O)c2)c1]

9. The resin composition of claim 1, wherein the oxydianiline type benzoxazine resin is represented by the following structure:

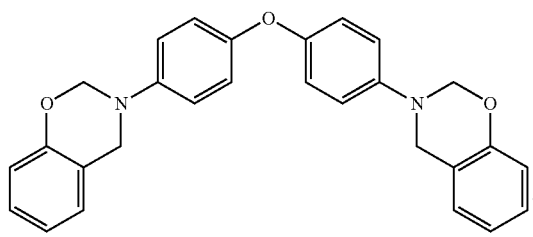

10. The resin composition of claim 1, further comprising polyphenylene ether resin, cyanate ester resin, isocyanurate resin, polyolefin resin, maleimide, polyester, an amine curing agent, polyamide, polyimide or a combination thereof.

11. The resin composition of claim 1, further comprising one or more than one additives selected from the following group: a curing accelerator, a flame retardant, an inorganic filler, a solvent, a toughening agent and a silane coupling agent.

12. A product made by baking the resin composition of claim 1.

13. The product of claim 12, which is a prepreg, a resin film, a resin-coated copper, a laminate or a printed circuit board.

14. The product of claim 13, having a glass transition temperature of 195° C. or greater when the product is measured by dynamic mechanical analyzer (DMA) by reference to IPC-TM-650 2.4.24.4.

15. The product of claim 13, having a T288 thermal resistance of greater than 60 minutes when the product is measured by thermomechanical analyzer (TMA) by reference to IPC-TM-650 2.4.24.1.

16. The product of claim 13, having a peel strength of 5.8 lb/in or greater for a half-ounce high-temperature elongation (HTE) copper foil when the product is measured by reference to IPC-TM-650 2.4.8.

17. The product of claim 13, having a dielectric constant of 3.70 or lower when the product is measured by reference to JIS C2565 at a condition of 70% resin content and 2 GHz frequency.

18. The product of claim 13, having a dissipation factor of 0.0100 or lower when the product is measured by reference to JIS C2565 at a condition of 70% resin content and 2 GHz frequency.

19. The product of claim 13, having a dimensional change of 0.020% or lower after 260° C. reflow when the product is measured by reference to IPC-TM-650 2.4.39.

20. The product of claim 13, wherein the product is subjected to a horizontal black oxide process during production, and wherein the product has a number of cycle-to-delamination in a solder dipping test of greater than 20 as measured by reference to IPC-TM-650 2.4.23.

21. The product of claim 13, having a storage modulus of greater than 4000 GPa when the product is measured by dynamic mechanical analyzer (DMA) by reference to IPC-TM-650 2.4.24.4, and having a stiffness of greater than 4000 N/m when the product is measured by DMA by reference to IPC-TM-650 2.4.24.4.

22. The product of claim 13, having a difference in warpage height between 260° C. and 30° C. of less than 1000 μm.

* * * * *